United States Patent
Lee et al.

(10) Patent No.: US 10,404,305 B2
(45) Date of Patent: Sep. 3, 2019

(54) WIRELESS COMMUNICATION DEVICE AND METHOD FOR SUPPORTING TRANSCEIVER PERFORMANCE BY SWITCHING BETWEEN A COUPLER PATH AND RECEIVE PATH

(71) Applicant: Samsung Electronics Co., Ltd., Gyeonggi-do (KR)

(72) Inventors: Young Min Lee, Seoul (KR); Jung Hwan Son, Seoul (KR); Yu Seon Lee, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/873,539

(22) Filed: Jan. 17, 2018

(65) Prior Publication Data

US 2018/0205405 A1    Jul. 19, 2018

(30) Foreign Application Priority Data

Jan. 17, 2017   (KR) ......................... 10-2017-0008295

(51) Int. Cl.
| | | |
|---|---|---|
| *H04B 1/30* | (2006.01) | |
| *H04B 1/10* | (2006.01) | |
| *H04B 1/525* | (2015.01) | |
| *H03D 7/14* | (2006.01) | |

(52) U.S. Cl.
CPC ............ *H04B 1/30* (2013.01); *H03D 7/1458* (2013.01); *H04B 1/109* (2013.01); *H04B 1/525* (2013.01)

(58) Field of Classification Search
CPC .......... H04B 1/525; H04B 1/109; H04B 1/30; H04B 1/401; H04B 1/44
See application file for complete search history.

(56) References Cited

U.S. PATENT DOCUMENTS

| | | | | |
|---|---|---|---|---|
| 9,154,243 | B2 | 10/2015 | Fernando | |
| 9,300,350 | B2* | 3/2016 | Baudin | H04B 1/006 |
| 2003/0176174 | A1* | 9/2003 | Seppinen | H04B 17/20 |
| | | | | 455/226.1 |
| 2004/0014449 | A1* | 1/2004 | Adachi | H04B 1/525 |
| | | | | 455/296 |
| 2006/0035601 | A1* | 2/2006 | Seo | H04B 1/40 |
| | | | | 455/78 |
| 2008/0182537 | A1* | 7/2008 | Manku | H04B 1/12 |
| | | | | 455/226.1 |
| 2009/0022246 | A1* | 1/2009 | Ando | H04B 1/0067 |
| | | | | 375/319 |

(Continued)

FOREIGN PATENT DOCUMENTS

KR    1020150105173    9/2015

*Primary Examiner* — Devan A Sandiford

(74) *Attorney, Agent, or Firm* — The Farrell Law Firm, P.C.

(57) ABSTRACT

An electronic device is provided that includes an antenna configured to receive a first signal and transmit a second signal. The electronic device also includes a transceiver configured to perform frequency conversion of the first signal and the second signal. The electronic device further includes a coupler path configured to transmit the second signal to the transceiver via a coupler, and a receive path configured to transmit the first signal, obtained from the antenna, to the transceiver. The electronic device also includes a switching unit configured to be connected with the transceiver and switch between the coupler path and the receive path.

13 Claims, 7 Drawing Sheets

(56) References Cited

U.S. PATENT DOCUMENTS

| | | | |
|---|---|---|---|
| 2009/0140789 A1 | 6/2009 | Birth | |
| 2010/0081408 A1* | 4/2010 | Mu | H03D 7/1441 |
| | | | 455/326 |
| 2010/0304701 A1* | 12/2010 | Jung | H04B 1/525 |
| | | | 455/280 |
| 2010/0327990 A1* | 12/2010 | Yang | H04B 1/525 |
| | | | 333/109 |
| 2011/0275341 A1* | 11/2011 | Landmark | H04B 1/109 |
| | | | 455/318 |
| 2011/0299575 A1* | 12/2011 | Aoulad Ali | H04B 1/525 |
| | | | 375/219 |
| 2013/0049882 A1* | 2/2013 | Yamashita | H04B 1/525 |
| | | | 333/133 |
| 2013/0071112 A1* | 3/2013 | Melester | H04B 17/0085 |
| | | | 398/38 |
| 2013/0072142 A1* | 3/2013 | Akula | H03G 3/3042 |
| | | | 455/129 |
| 2013/0344827 A1* | 12/2013 | Epifano | H04B 1/0475 |
| | | | 455/114.3 |
| 2014/0171001 A1 | 6/2014 | Fernando | |
| 2014/0233618 A1* | 8/2014 | Krishnan | H04B 17/14 |
| | | | 375/222 |
| 2015/0207576 A1* | 7/2015 | Huang | H04B 17/0085 |
| | | | 370/249 |
| 2015/0256214 A1* | 9/2015 | Lee | H04B 17/14 |
| | | | 455/83 |
| 2015/0288467 A1* | 10/2015 | Kahrizi | H04B 17/21 |
| | | | 370/241 |
| 2016/0156423 A1* | 6/2016 | Lim | H04B 15/00 |
| | | | 370/276 |
| 2018/0097608 A1* | 4/2018 | Takahashi | H04B 1/0067 |
| 2018/0152191 A1* | 5/2018 | Niwa | H04B 1/0458 |

* cited by examiner

WIRELESS COMMUNICATION DEVICE AND METHOD FOR SUPPORTING TRANSCEIVER PERFORMANCE BY SWITCHING BETWEEN A COUPLER PATH AND RECEIVE PATH

PRIORITY

This application claims priority under 35 U.S.C. § 119(a) to a Korean Patent Application filed on Jan. 17, 2017 in the Korean Intellectual Property Office and assigned Serial Number 10-2017-0008295, the entire disclosure of which is incorporated herein by reference.

BACKGROUND

1. Field of the Disclosure

Embodiments of the present disclosure relate to second order intermodulation product (IIP2) calibration technologies.

2. Description of the Related Art

A mixer may include a down-conversion mixer for converting a high frequency signal per gigahertz (GHz) or megahertz (MHz) into a low frequency signal of a few kilohertz (kHz), and an up-conversion mixer for converting a low frequency signal into a high frequency signal. The down-conversion mixer may be directly associated with sensitivity.

If a local oscillator (LO) frequency and two or more radio frequency (RF) signals are input to the mixer, a signal of a $2^{nd}$ intermodulation (IMD) term may be generated. The signal of the $2^{nd}$ IMD term may greatly interfere with a signal that is analyzed as a receive component by a signal transceiver and may result in deterioration in sensitivity. A design of a mixer with an excellent $2^{nd}$ IMD characteristic is of great importance in a wireless communication system.

An IIP2 may be used as an index for a mixer, indicating how large a $2^{nd}$ IMD component is. Since an undesirable signal (e.g., a leakage signal) is of a higher level, a signal of a $2^{nd}$ IMD term may be increased to a greater extent. If an IIP2 index is high, since the signal of the $2^{nd}$ IMD term is reduced, there may be a gain in view of reception performance.

If there is an external leakage signal, ensuring performance of an IIP2 index may be very important in enhancing performance of receive sensitivity. To ensure IIP2 performance with respect to some time division duplex (TDD) bands, a method of calibrating an IIP2 in a board may be used. The method of calibrating the IIP2 in the board may be diverse according to a register structure or the like in terms of a mixer design scheme, a modem, or software.

If a degree of leakage is large with respect to a frequency division duplex (FDD) band, a receive surface acoustic wave (SAW) filter may be used as a hardware structure rather than IIP2 calibration.

A conventional method of calibrating IIP2 is possible for some TDD bands. A method of inserting a circuit for IIP2 measurement into a transceiver may be attempted for IIP2 calibration. However, there are problems such as integration and internal interference and it is difficult to be universally used.

It may be difficult to apply a conventional IIP2 calibration method to an FDD band. In implementing an FDD band, a duplexer may remove a leakage signal on a receive path (e.g., a leakage signal due to a transmit signal) due to the nature of its component. However, since an amount in which a signal is removed at intervals of a few Hz varies according to a frequency, it is difficult to perform IIP2 calibration.

SUMMARY

Aspects of the present disclosure provide a transceiver device for effectively ensuring an IIP2 characteristic of a transceiver without having an influence on conventional transmission and reception performance and a method thereof.

In accordance with an aspect of the present disclosure, an electronic device is provided that includes an antenna configured to receive a first signal and transmit a second signal. The electronic device also includes a transceiver configured to perform frequency conversion of the first signal and the second signal. The electronic device further includes a coupler path configured to transmit the second signal to the transceiver via a coupler, and a receive path configured to transmit the first signal, obtained from the antenna, to the transceiver. The electronic device also includes a switching unit configured to be connected with the transceiver and switch between the coupler path and the receive path.

In accordance with another aspect of the present disclosure, an electronic device is provided. The electronic device includes an antenna configured to receive a first signal and transmit a second signal. The electronic device also includes a transceiver configured to perform frequency conversion of the first signal and the second signal. The electronic device further includes a coupler path configured to transmit the second signal to the transceiver via a coupler, and a plurality of receive paths configured to transmit the first signal, obtained from the antenna, to the transceiver. The electronic device also includes a switching unit configured to be connected with the transceiver and switch between the coupler path and at least one of the plurality of receive paths.

BRIEF DESCRIPTION OF THE DRAWINGS

The above and other aspects, features, and advantages of embodiments of the present disclosure will be more apparent from the following description when taken in conjunction with the accompanying drawings, in which.

DETAILED DESCRIPTION

Figure 1:
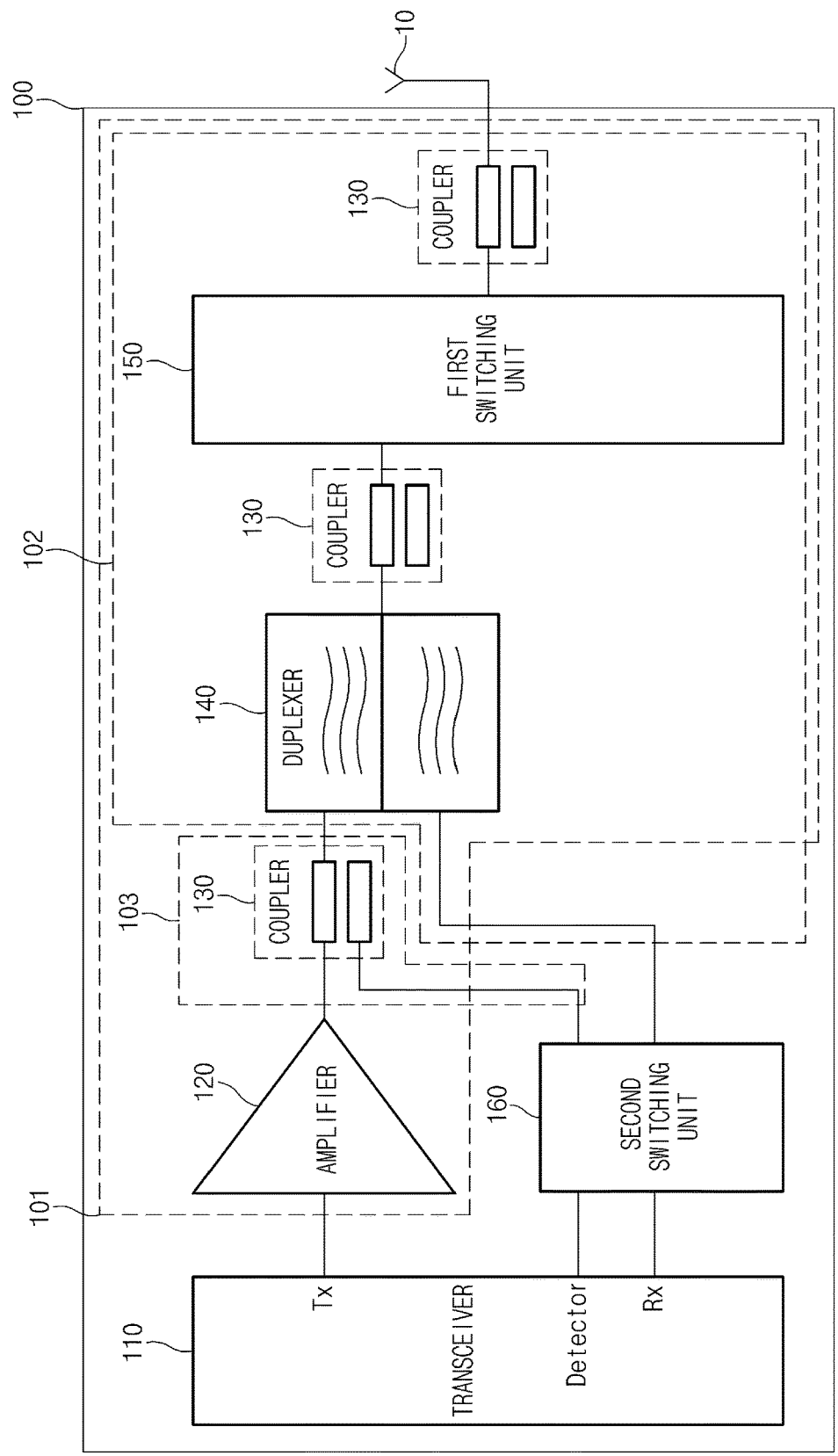
FIG. 1 is a block diagram illustrating a configuration of a transceiver circuit included in an electronic device, according to an embodiment of the present disclosure.

Embodiments of the present disclosure are described with reference to accompanying drawings. The same or similar components may be designated by the same or similar reference numerals although they are illustrated in different drawings. Detailed descriptions of constructions or processes known in the art may be omitted to avoid obscuring the subject matter of the present disclosure.

Herein, the expressions "have", "may have", "include", "comprise", "may include", and "may comprise" indicate the existence of corresponding features (e.g., elements such as numeric values, functions, operations, or components) but do not exclude the presence of additional features.

Herein, the expressions "A or B", "at least one of A and B", or "one or more of A and B", and the like may include any and all combinations of one or more of the associated listed items. For example, the expressions "A or B", "at least one of A and B", and "at least one of A or B" may refer to the case (1) where at least one A is included, (2) where at least one B is included, or (3) where both of at least one A and at least one B are included.

Terms such as "first", "second", and the like, as used herein, may be used to refer to various elements regardless of the order and/or the priority and to distinguish the relevant elements from other elements, but do not limit the elements. For example, "a first user device" and "a second user device" indicate different user devices regardless of the order or priority. For example, without departing the scope of the present disclosure, a first element may be referred to as a second element, and similarly, a second element may be referred to as a first element.

When an element (e.g., a first element) is referred to as being "(operatively or communicatively) coupled with/to" or "connected to" another element (e.g., a second element), it may be directly coupled with/to or connected to the other element or an intervening element (e.g., a third element) may be present. In contrast, when an element (e.g., a first element) is referred to as being "directly coupled with/to" or "directly connected to" another element (e.g., a second element), it should be understood that there are no intervening element (e.g., a third element).

According to the situation, the expression "configured to", as used herein, may be used interchangeably with, for example, the expressions "suitable for", "having the capacity to", "designed to", "adapted to", "made to", or "capable of". The term "configured to" does not only mean "specifically designed to" in hardware. Instead, the expression "a device configured to" may mean that the device is "capable of" operating together with another device or other components. For example, a "processor configured to (or set to) perform A, B, and C" may mean a dedicated processor (e.g., an embedded processor) for performing a corresponding operation or a generic-purpose processor (e.g., a central processing unit (CPU) or an application processor (AP)), which performs corresponding operations by executing one or more software programs which are stored in a memory device.

Terms used herein are used to describe specified embodiments and are not intended to limit the scope of another embodiment. The terms of a singular form may include plural forms unless otherwise specified. All terms used herein, which include technical or scientific terms, may have the same meanings that are generally understood by a person skilled in the art. It will be further understood that terms, which are defined in a dictionary and commonly used, should also be interpreted as is customary in the relevant related art and not in an idealized or overly formal manner, unless expressly so defined herein. In some cases, even if terms are defined herein, they may not be interpreted to exclude embodiments of this disclosure.

An electronic device, according to embodiments of the present disclosure, may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, and wearable devices. The wearable device may include at least one of an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), and a bio-implantable type (e.g., an implantable circuit).

The electronic device may be a home appliance. The home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, electronic picture frames, and the like.

According to another embodiment, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, global navigation satellite system (GNSS), event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller machines (ATMs), point of sales (POS) devices of stores, or Internet of things (IoT) devices (e.g., light bulbs, various sensors, electric or gas meters, sprinkler devices, fire alarms, thermostats, street lamps, toasters, exercise equipment, hot water tanks, heaters, boilers, and the like).

According to an embodiment, the electronic device may include at least one of parts of furniture or buildings/structures, electronic boards, electronic signature receiving devices, projectors, or various measuring instruments (e.g., water meters, electricity meters, gas meters, or wave meters, and the like). The electronic device may be one of the above-described devices or a combination thereof. An electronic device may be a flexible electronic device. Furthermore, an electronic device may not be limited to the above-described electronic devices, and may include other electronic devices and new electronic devices according to the development of technologies.

Hereinafter, electronic devices will be described with reference to the accompanying drawings. In this disclosure, the term "user" may refer to a person who uses an electronic device or may refer to a device (e.g., an artificial intelligence electronic device) that uses the electronic device.

Embodiments described herein may reduce costs for designing a transceiver circuit and may reduce a size of a space occupied by the transceiver circuit.

FIG. 1 is a block diagram illustrating a configuration of a transceiver circuit included in an electronic device, according to an embodiment of the present disclosure.

Referring to FIG. 1, a transceiver circuit 100 in an electronic device includes an antenna 10, a transceiver 110, an amplifier 120, a coupler 130, a duplexer 140, a first switching unit 150 for selecting the antenna 10, and a second switching unit 160 for switching between a receive path 102 and a coupler path 103.

The transceiver 110 may perform frequency conversion. The transceiver 110 may include a mixer for performing frequency up-conversion and/or frequency down-conversion. The mixer may perform frequency down-conversion of receiving an RF signal of a high frequency band, received via the antenna 10, synthesizing the received RF signal with an LO signal, and outputting a baseband signal of a low frequency band. An output transmit (Tx) port of the transceiver 110 is connected with an amplifier 120.

The amplifier 120 may amplify power of a transmit signal. The amplifier 120 is connected between the output port Tx of the transceiver 110 and a coupler 130 or a duplexer 140.

The coupler 130 may transmit a signal, transmitted from one circuit, to another circuit. Referring to FIG. 1, the coupler 130 may be a connection part that transmits a transmit signal, transmitted on a transmit path 101, to the coupler path 103. The coupler 130 may be located at each of various locations on the transceiver circuit 100 depending on convenience and efficiency. The coupler 130 is connected between the amplifier 120 and the duplexer 140. According to another embodiment, the coupler 130 may be connected between the duplexer 140 and the first switching unit 150. According to another embodiment, the coupler 130 may be connected between the first switching unit 150 and the antenna 10. The coupler 130 may be connected between the duplexer 140 and the antenna 10. The coupler 130 may transmit a transmit signal, output from the amplifier 120 on the transmit path 101, to the coupler path 103. The coupler 130 may transmit a transmit signal, output from the duplexer 140 on the transmit path 101, to a coupler path. The coupler 130 may transmit a transmit signal, output from the first switching unit 150 on the transmit path 101, to the coupler path.

The duplexer 140 may divide a transmit and receive frequency of the electronic device. The duplexer 140 may be used to implement an FDD system. In case of the FDD system, there may be an influence of intermodulation (IM) by a Tx leakage signal introduced from the transmit path 101 to the receive path 102 through the duplexer 140. A conventional transceiver circuit uses a SAW filter for removing a Tx leakage signal, but has a problem due to an increase in an external element or the like. The transceiver circuit 100 of FIG. 1 may include a radio frequency front end (RFFE) of a SAWless structure that does not include a SAW filter. The transceiver circuit 100 includes the second switching unit 160 for reducing an influence of IM on a Tx leakage signal.

The first switching unit 150 may include a switch for selecting the antenna 10. The first switching unit 150 may be referred to as an antenna switching module.

The second switching unit 160 may be a switch for IIP2 calibration. The second switching unit 160 may switch between a first mode and a second mode. The first mode may be a general mode, and the second mode may be an IIP2 calibration mode. The second switching unit 160 may switch between the receive path 102 and the coupler path 103. The second switching unit 160 may switch a port, to which a transmit signal output from the coupler 130 is input, from a detection port to a receive port or from the receive port to the detection port. The second switching unit 160 may switch a port, to which a receive signal output from the duplexer 140 is input, from the detection port to the receive port or from the receive port to the detection port.

An output end of the second switching unit 160 is connected to a detection port detector and/or at least one receive (Rx) port of the transceiver 110. The second switching unit 160 may include a dual pole multi throw (DPxT).

A signal of a transmit frequency may indicate the highest signal in the electronic device during a call connection and may be the highest leakage component, which causes deterioration in sensitivity. In the second mode for performing IIP2 calibration, the transceiver circuit 100 may provide the signal of the transmit frequency as a signal for IIP2 calibration.

While the second switching unit 160 operates in the second mode for performing the IIP2 calibration, the electronic device may connect the coupler path 103, to which power returns via the coupler 130, to the receive port Rx of the transceiver 110. While the second switching unit 160 performs an operation in the first mode (e.g., calibration except for IIP2 calibration and/or an operation in a call situation), the coupler path 103 may be connected to the detection port Detector of the transceiver 110, and the transceiver circuit 100 may perform power detection.

A deviation of a signal distortion may be greatly indicated for each frequency in the duplexer 140. According to a structure of the transceiver circuit 100 of FIG. 1, since a signal distortion of a transmit frequency due to the duplexer 140 is not generated on an IIP2 calibration path, IIP2 calibration in the FDD system may be possible. The transceiver circuit 100 may be efficiently designed at low costs and an IIP2 shake due to a chip variation may be easily controlled.

Figure 2:
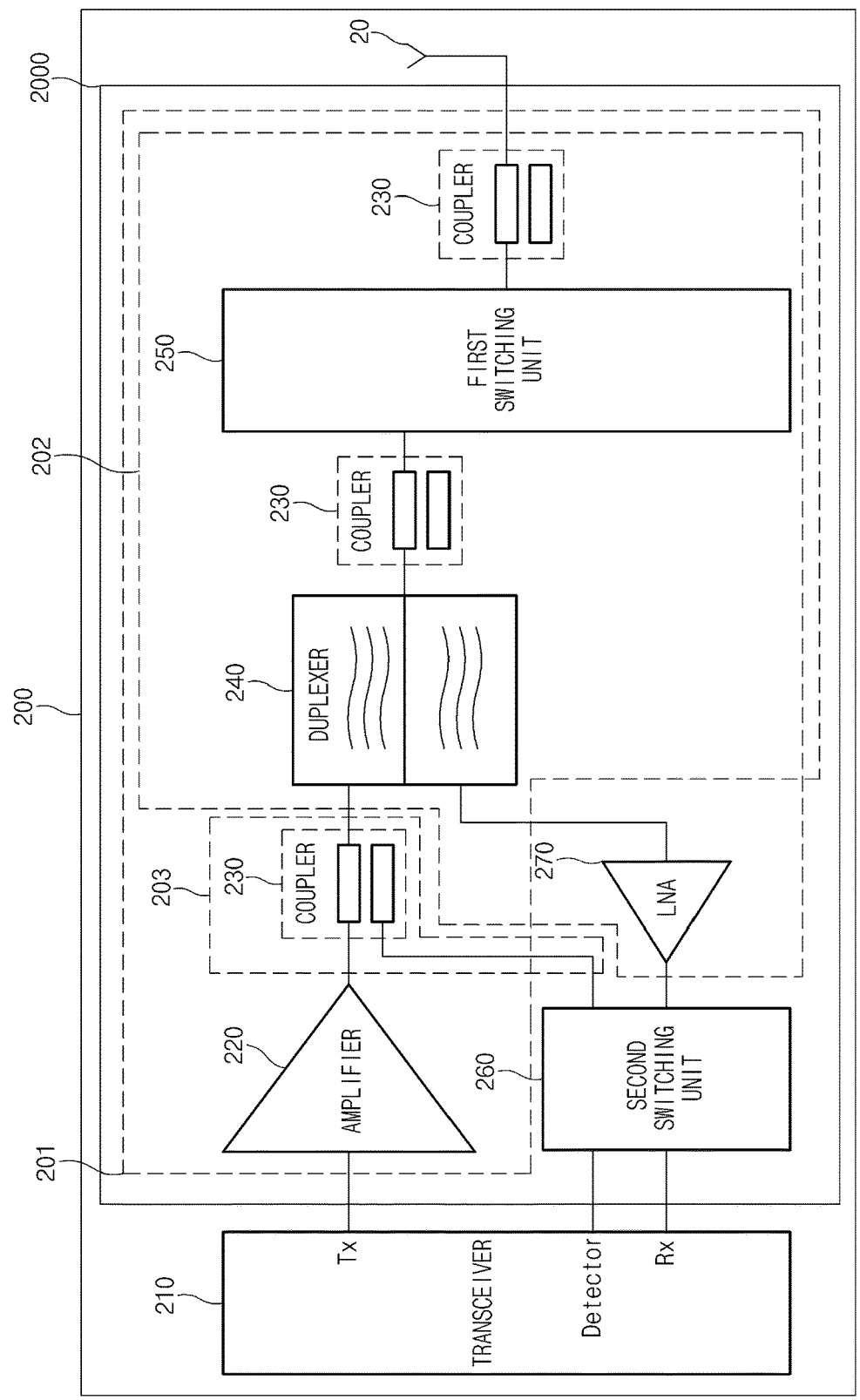
FIG. 2 is a block diagram illustrating a configuration of a transceiver circuit included in an electronic device, according to another embodiment of the present disclosure.

FIG. 2 is a block diagram illustrating a configuration of a transceiver circuit included in an electronic device, according to another embodiment of the present disclosure.

Referring to FIG. 2, a transceiver circuit 200 includes an IIP2 calibration module 2000, an antenna 20, and a transceiver 210. The IIP2 calibration module 2000 includes an amplifier 220, a duplexer 240, a first switching unit 250, and a low noise amplifier (LNA) 270.

The antenna 20, the transceiver 210, the amplifier 220, a coupler 230, the duplexer 240, the first switching unit 250, and a second switching unit 260 included in the transceiver circuit 200 of FIG. 2, respectively correspond to the antenna 10, the transceiver 110, the amplifier 120, the coupler 130, the duplexer 140, the first switching unit 150, and the second switching unit 160 of FIG. 1.

Referring to FIG. 2, the transceiver circuit 200 further includes the LNA 270. The LNA 270 may amplify a signal from the antenna 20. If a noise figure of the LNA 270 is low, a noise generated from the LNA 270 may be reduced. The LNA 270 may amplify a signal of a low level without a great influence of noise. The LNA 270 is connected between the duplexer 240 and the second switching unit 260. An output of the LNA 270 is input to an input end of the second switching unit 260. A path where an output of the duplexer 240 passes through the LNA 270 may be referred to as an LNA path. A receive path 202 may include the LNA path.

A loss of a noise figure due to a loss of the second switching unit 260 may be generated. According to a structure of the transceiver circuit 200 of FIG. 2, there may be a gain in view of a noise figure due to the insertion of the LNA 270.

The second switching unit 260 may switch a port, to which an output signal of the coupler 230 is input, between a detection port and a receive port. The second switching unit 260 may switch a port, to which an output signal of the LNA 270 is input, between the detection port and the receive port.

Figure 3:
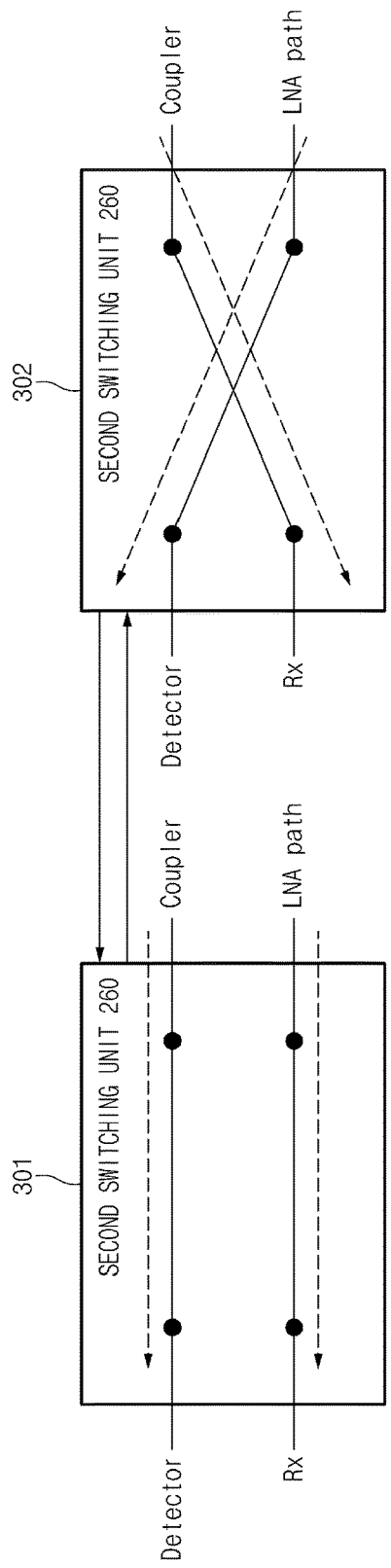
FIG. 3 is a diagram illustrating a switching operation, according to an embodiment of the present disclosure.

FIG. 3 is a diagram illustrating a switching operation, according to an embodiment of the present disclosure.

An operation of a second switching unit of FIG. 3 is provided based on the second switching unit 260 of FIG. 2.

The second switching unit 260 may switch between a first mode 301 and a second mode 302. The second switching unit 260 includes four contact points.

A transceiver circuit may perform a normal operation except for an IIP2 calibration operation (e.g., transmit and receive calibration or an operation of a call connection state). If the second switching unit 260 operates in the first mode 301, a contact point connected to a coupler or a coupler path may be connected with a contact point connected to a detection port Detector. A contact point connected to an LNA or an LNA path may be connected to a contact point connected to a receive port Rx.

The second mode 302 may be an operation of the second switching unit 260 if it is necessary for an IIP2 calibration operation. In the second mode 302, the contact point connected to the coupler or the coupler path may be connected with the contact point connected to the receive port Rx. In the second mode, the contact point connected to the LNA or the LNA path may be connected with the contact point connected to the detection port Detector. The second switching unit 260 may include a high-isolated switch. Deterioration in sensitivity due to a switch may be generated during a basic call connection. A signal over a path may be generated between a receive path formed at the receive port Rx and a detection path formed at the detection port Detector. If the high-isolated switch is used, a phenomenon in which a signal crosses a path may be prevented. For example, if there are a coupling factor of 20 decibel (dB) or more and isolation of 30 dB or more in a switch, since $2^{nd}$ IMD due to a switch is formed below −180 dBm/Hz depending on Equation (1) below, deterioration in sensitivity may fail to be generated. Equation (1) indicates a relationship between IIP2 and $2^{nd}$ IMD terms.

$$(2 \times P_{leakage}) - IIP2 = 2^{nd}IMD \quad (1)$$

$P_{leakage}$ corresponds to a level of an undesirable signal (e.g., a leakage signal), and IIP2 indicates an index for a mixer, indicating how large a $2^{nd}$ IMD component is. Referring to Equation (1), as $P_{leakage}$ increases, $2^{nd}$ IMD further increases. If an IIP2 index is high, a signal of a $2^{nd}$ IMD term may be reduced.

IIP2 calibration may be applied to an FDD system. If a receive SAW filter is removed, since a Tx leakage signal is heightened, deterioration in sensitivity may be generated. If IIP2 calibration is performed, sensitivity may be enhanced. Table 1 may be the result of measuring sensitivity if a receive SAW filter is removed in a state in which an external LNA is connected as shown in FIG. 2.

TABLE 1

| | Sensitivity in SAWless structure | |
|---|---|---|
| Transmit power | Before IIP2 calibration | After IIP2 calibration |
| 23 dBm | −99 | −100.5 |
| 0 dBm | −101 | −101 |

If IIP2 calibration is enhanced, sensitivity may be enhanced as shown in Table 1. Referring to Table 1, since an influence of a transmit leakage power is insignificant if a transmit power is 0 dBm, there may be no difference in sensitivity before and after IIP2 calibration. If a transmit power is 23 dBm, sensitivity may be more enhanced after IIP2 calibration than before IIP2 calibration due to a transmit leakage power.

Figure 4:
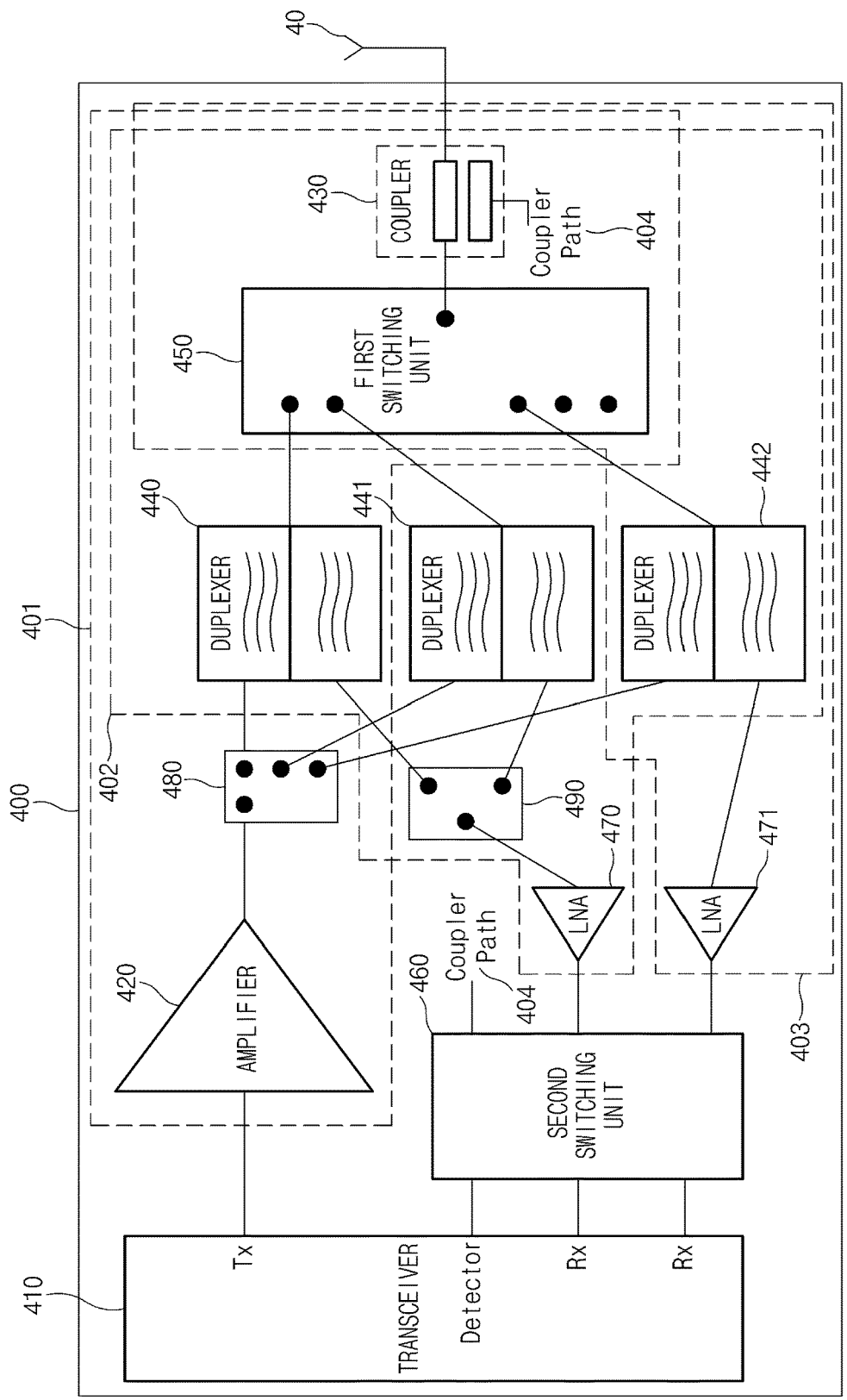
FIG. 4 is a block diagram illustrating a configuration of a transceiver circuit included in an electronic device, according to another embodiment of the present disclosure.

FIG. 4 is a block diagram illustrating a configuration of a transceiver circuit included in an electronic device, according to another embodiment of the present disclosure.

Referring to FIG. 4, a transceiver circuit 400 includes an antenna 40, a transceiver 410, an amplifier 420, a coupler 430, a plurality of duplexers 440 to 442, a first switching unit 450, a second switching unit 460, a plurality of LNAs 470 and 471, a third switching unit 480 for selecting a duplex to which its output signal is input, and a fourth switching unit 490 for selecting a duplex which provides an input to a specific LNA.

The antenna 40, the transceiver 410, the amplifier 420, the coupler 430, the plurality of duplexers 440 to 442, the first switching unit 450, and the second switching unit 460 included in the transceiver circuit 400 of FIG. 4, respectively correspond to the antenna 20, the transceiver 210, the amplifier 220, the coupler 230, the duplexer 240, the first switching unit 250, the second switching unit 260, and the LNA 270 of FIG. 2.

Referring to FIG. 4, the transceiver 410 includes a transmit port Tx, a detection port Detector, and a plurality of receive ports Rx.

The amplifier 420 is connected to the third switching unit 480. An output signal, the power of which is amplified by the amplifier 420, may be provided to the third switching unit 480. The third switching unit 480 may select at least one of the plurality of duplexers 440 to 442.

The plurality of duplexers 440 to 442 is connected between the third switching unit 480 and the first switching unit 450. In another embodiment, at least one of the plurality of duplexers 440 to 442 may be connected between at least one of the plurality of LNAs 470 and 471 (e.g., the LNA 471) and the first switching unit 450. An output signal of at least one duplexer (e.g., the duplexer 440) selected by the third switching unit 480 may be transmitted via the antenna 40 selected by the first switching unit 450. An output signal of at least one duplexer (e.g., the duplexer 441) selected by the fourth switching unit 490 may be provided to at least one LNA (e.g., the LNA 470).

FIG. 4 illustrates that the coupler 430 is connected between the first switching unit 450 and the antenna 40. However, as shown in FIG. 1, a location of the coupler 430 may be modified in various manners. In an embodiment, the coupler 430 may transmit an output of the amplifier 420 on a transmit path 401 to a coupler path 404.

At least one of the plurality of LNAs 470 and 471 (e.g., the LNA 471) is connected between the duplexer 442 and the second switching unit 460. At least one of the plurality of LNAs 470 and 471 (e.g., the LNA 470) is connected between the fourth switching unit 490 and the duplexer 441. The LNA 470 may obtain an output of the duplexer 441 selected by the fourth switching unit 490 among the duplexers 440 and 441 as an input.

The second switching unit 460 may switch between a first mode and a second mode. The second switching unit 460 may switch a port, to which the coupler path 404 is connected, between a detection port Detector and a receive port Rx of the transceiver 410. In an embodiment, the second switching unit 460 may connect at least one of a receive path 402 and a receive path 403 to at least one receive port Rx in the first mode and may connect the coupler path 404 to the detection port Detector in the first mode. The second switching unit 460 may connect the receive path 402 to the detection port Detector in the second mode and may connect the coupler path 404 to the receive port Rx in the second mode. The receive path 402 may transmit a receive signal output from the duplexer 440. The receive path 402 may include an LNA path which transmits an output signal of the LNA 470. The second switching unit 460 may include a dual pole multi throw (DPxT).

While the transceiver circuit 400 operates in the first mode, the second switching unit 460 may connect the receive path 402 and/or the receive path 403 with the receive port Rx and may connect the coupler path 404 with the detection port Detector. While the transceiver circuit 400 operates in the second mode for performing IIP2 calibration, the second switching unit 460 may connect any one (e.g., the receive path 402) of the receive paths 402 and 403 with the detection port Detector. The second switching unit 460 may connect the coupler path 404 to the receive port Rx which is connected with the receive path 402 in the first mode.

Figure 5:
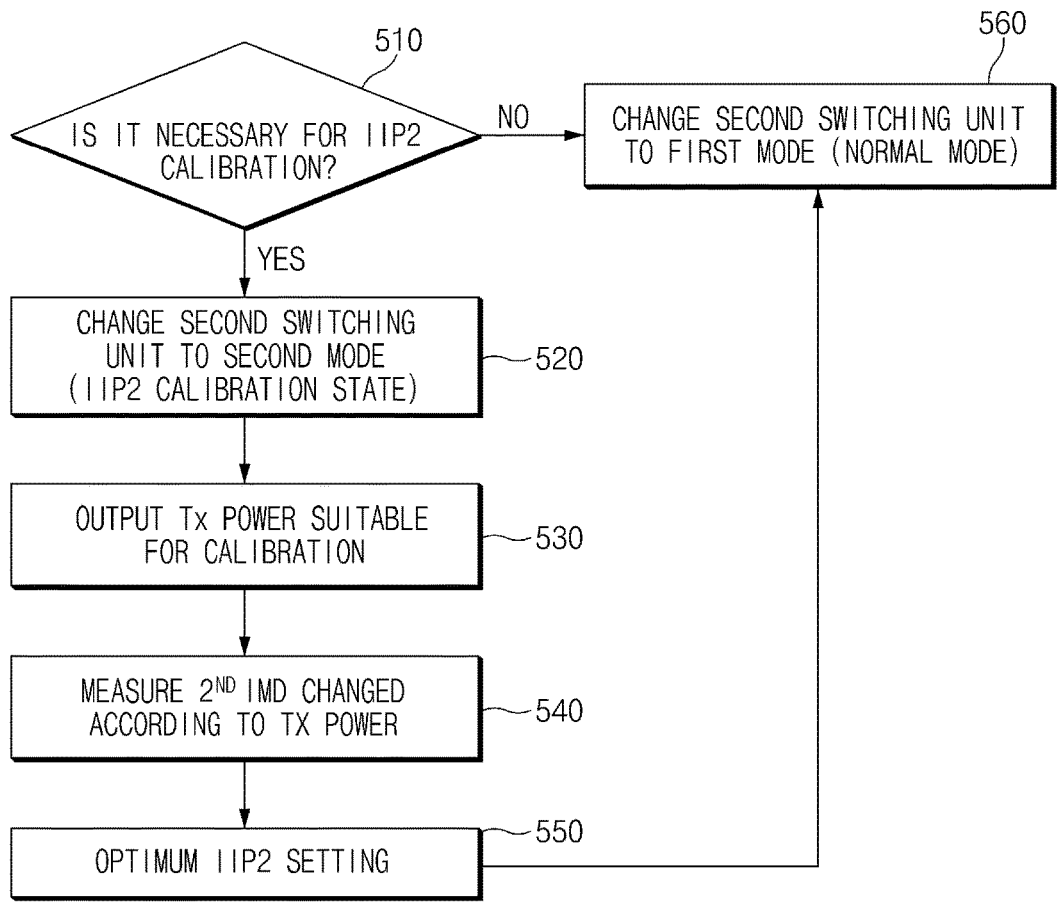
FIG. 5 is a flowchart illustrating an operation of an electronic device, according to an embodiment of the present disclosure.

FIG. 5 is a flowchart illustrating an operation of an electronic device, according to an embodiment of the present disclosure. The electronic device may perform an optimum setting necessary for IIP2 calibration. The electronic device in FIG. 5 may further include a processor, a module, or a modem, which is connected to a transceiver circuit.

Referring to FIG. 5, in operation 510, the electronic device determines whether it is necessary for IIP2 calibration.

If it is necessary for the IIP2 calibration, in operation 520, the electronic device operates in a second mode. The electronic device may change a second switching unit to a second mode, which is a state in which the IIP2 calibration may be performed.

In operation 530, the electronic device determines a Tx power suitable for the IIP2 calibration. The electronic device may transmit a signal with the Tx power suitable for the IIP2 calibration.

In operation 540, the electronic device measures a $2^{nd}$ IMD term. A $2^{nd}$ IMD value may vary according to a Tx power.

In operation 550, the electronic device performs an optimum setting for the IIP calibration. The electronic device may determine an optimum Tx power based on the $2^{nd}$ IMD value or may determine an IIP2 parameter based on the $2^{nd}$ IMD value. The electronic device may perform a setting for the IIP2 calibration.

In operation 560, the electronic device changes an operation to the first mode. The electronic device may change the second switching unit to the first mode.

As a result of performing operation 510, if it is not necessary for the IIP2 calibration, in operation 560, the electronic device may operate in the first mode. The electronic device may set or change the second switching unit to the first mode.

Figure 6:
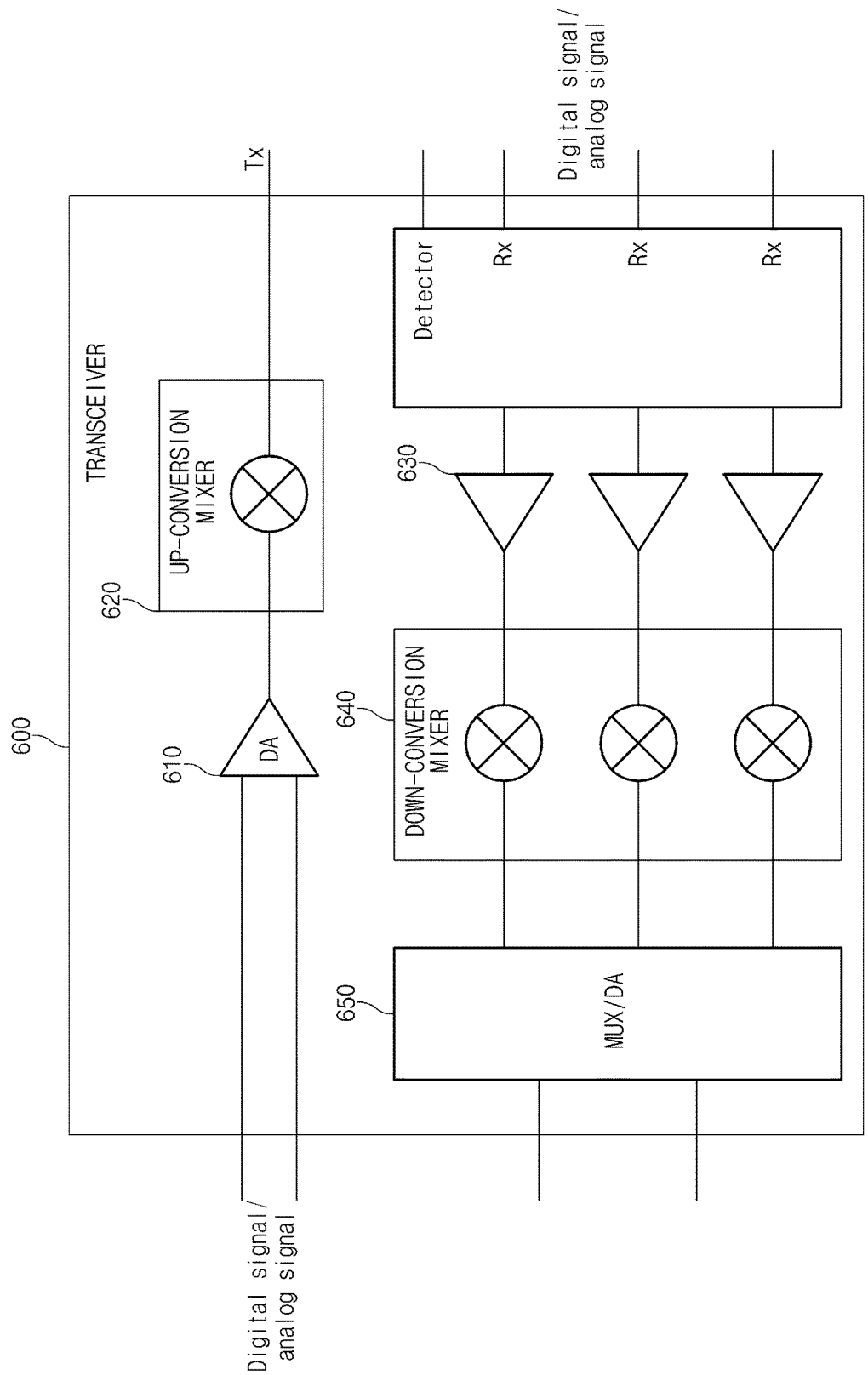
FIG. 6 is a block diagram illustrating a configuration of a transceiver, according to an embodiment of the present disclosure.

FIG. 6 is a block diagram illustrating a configuration of a transceiver, according to an embodiment of the present disclosure.

Referring to FIG. 6, a transceiver 600 includes a transmit chain for transmitting a digital signal and/or an analog signal and a receive chain for receiving a digital signal and/or an analog signal. The transmit chain includes a driver amplifier (DA) 610 and an up-conversion mixer 620 for up-converting a frequency. The receive chain includes at least one of an LNA 630, a down-conversion mixer 640, a multiplexer/DA MUX/DA 650. The receive chain may further include an LO that generates an LO signal. A signal input through a receive port Rx may be amplified by the LNA 630.

The down-conversion mixer 640 may perform frequency down-conversion of receiving an RF signal of a high frequency band, synthesizing the receive RF signal with an LO signal, and outputting a baseband signal of a low frequency band.

Figure 7:
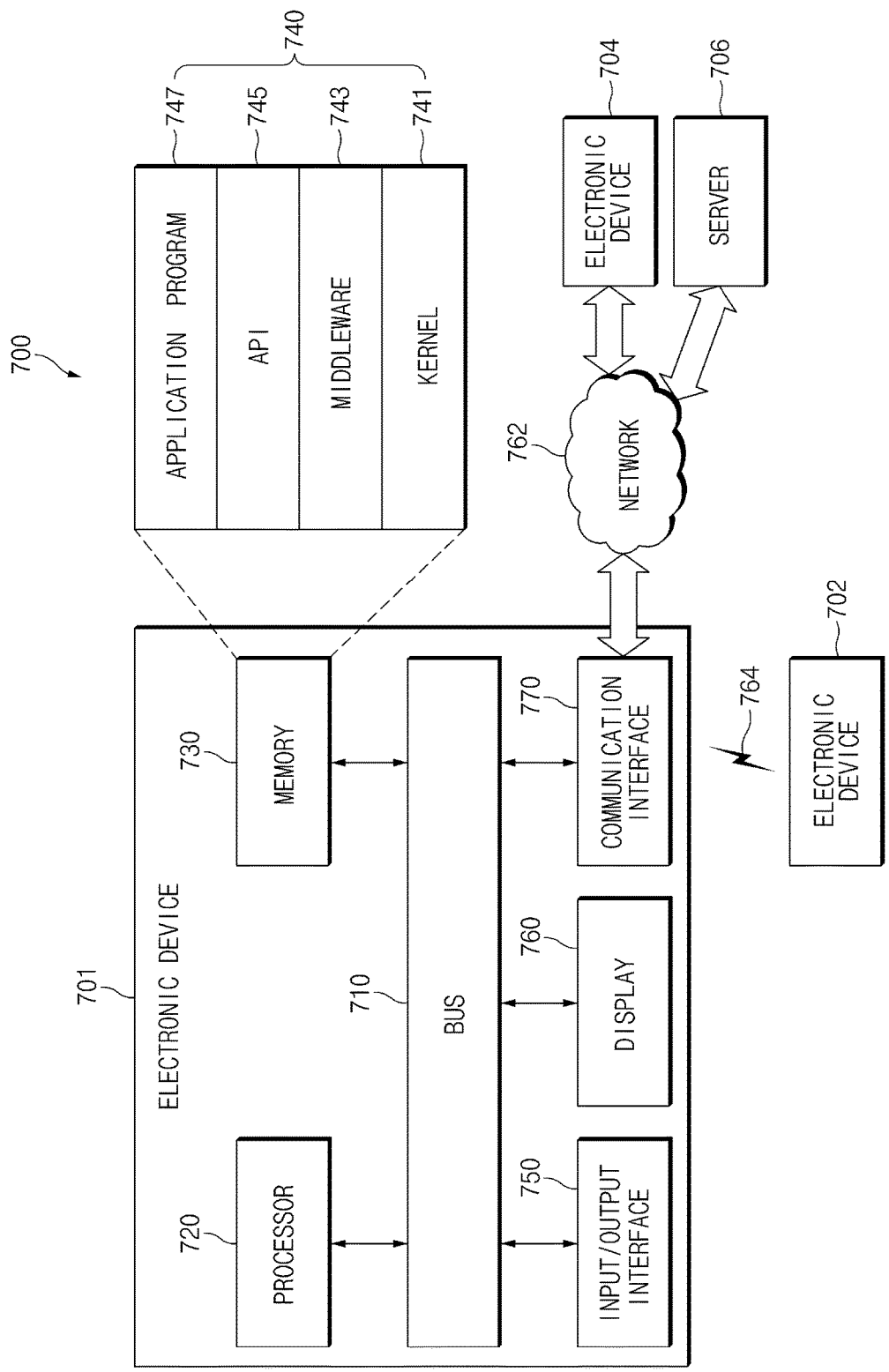
FIG. 7 is a block diagram illustrating a configuration of an electronic device in a network environment, according to an embodiment of the present disclosure.

FIG. 7 is a block diagram illustrating a configuration of an electronic device in a network environment, according to an embodiment of the present disclosure.

Referring to FIG. 7, an electronic device 701, a first external electronic device 702, a second external electronic device 704, and a server 706 may be connected with each other over a network 762 or local wireless communication 764. The electronic device 701 includes a bus 710, a processor 720, a memory 730, an input/output interface 750, a display 760, and a communication interface 770. The electronic device 701 may not include at least one of the above-described elements or may further include one or more additional elements.

The bus 710 interconnects the above-described elements 720 to 770 and may include a circuit for conveying communications (e.g., a control message and/or data) among the above-described elements.

The processor 720 may include one or more of a CPU, an AP, and a communication processor (CP). For example, the processor 720 may perform an arithmetic operation or data processing associated with control and/or communication of at least other elements of the electronic device 701.

The memory 730 may include a volatile and/or nonvolatile memory. For example, the memory 730 may store instructions or data associated with at least one other element(s) of the electronic device 701. The memory 730 stores software and/or a program 740. The program 740 includes, for example, a kernel 741, a middleware 743, an application programming interface (API) 745, and an application program (or an application) 747. At least a part of the kernel 741, the middleware 743, or the API 745 may be referred to as an operating system (OS).

For example, the kernel 741 may control or manage system resources (e.g., the bus 710, the processor 720, the memory 730, and the like) that are used to execute operations or functions of other programs (e.g., the middleware 743, the API 745, and the application program 747). Furthermore, the kernel 741 may provide an interface that allows the middleware 743, the API 745, or the application program 747 to access discrete elements of the electronic device 701 so as to control or manage system resources.

The middleware 743 may perform, for example, a mediation role such that the API 745 or the application program 747 communicates with the kernel 741 to exchange data.

Furthermore, the middleware 743 may process one or more task requests received from the application program 747 according to a priority. For example, the middleware 743 may assign the priority, which makes it possible to use a system resource (e.g., the bus 710, the processor 720, the memory 730, or the like) of the electronic device 701, to at least one of the application program 747. For example, the middleware 743 may process the one or more task requests according to the priority assigned to the at least one, which makes it possible to perform scheduling or load balancing on the one or more task requests.

The API 745 may be, for example, an interface through which the application program 747 controls a function provided by the kernel 741 or the middleware 743, and may include, for example, at least one interface or function (e.g., an instruction) for a file control, a window control, image processing, a character control, or the like.

The input/output interface 750 may play a role, for example, an interface that transmits an instruction or data input from a user or another external device, to other element(s) of the electronic device 701. Furthermore, the input/output interface 750 may output an instruction or data, received from other element(s) of the electronic device 701, to a user or another external device.

The display 760 may include, for example, a liquid crystal display (LCD), a light-emitting diode (LED) display, an organic LED (OLED) display, a microelectromechanical systems (MEMS) display, or an electronic paper display. The display 760 may display, for example, various contents (e.g., a text, an image, a video, an icon, a symbol, and the like) to a user. The display 760 may include a touch screen and may receive, for example, a touch, gesture, proximity, or hovering input using an electronic pen or a part of a user's body.

For example, the communication interface 770 may establish communication between the electronic device 701 and the first external electronic device 702, the second external electronic device 704, or the server 706. For example, the communication interface 770 may be connected to the network 762 over wireless communication or wired communication to communicate with the second external electronic device 704 or the server 706.

The wireless communication may use at least one of, for example, long-term evolution (LTE), LTE Advanced (LTE-A), code division multiple access (CDMA), wideband CDMA (WCDMA), universal mobile telecommunications system (UMTS), wireless Broadband (WiBro), global system for mobile communications (GSM), and the like, as cellular communication protocol. Furthermore, the wireless communication may include, for example, the local wireless communication 764. The local wireless communication 764 may include at least one of wireless fidelity (Wi-Fi), bluetooth, near field communication (NFC), magnetic stripe transmission (MST), a GNSS, or the like.

The MST may generate a pulse in response to transmission data using an electromagnetic signal, and the pulse may generate a magnetic field signal. The electronic device 701 may transfer the magnetic field signal to a POS device, and the POS device may detect the magnetic field signal using an MST reader. The POS device may recover the data by converting the detected magnetic field signal to an electrical signal.

The GNSS may include at least one of, for example, a global positioning system (GPS), a global navigation satellite system (Glonass), a Beidou navigation satellite system (Beidou), or a European global satellite-based navigation system (Galileo) based on an available region, a bandwidth, or the like. Hereinafter, in this disclosure, "GPS" and "GNSS" may be interchangeably used. The wired communication may include at least one of, for example, a universal serial bus (USB), a high definition multimedia interface (HDMI), a recommended standard-232 (RS-232), a plain old telephone service (POTS), and the like. The network 762 may include at least one of telecommunications networks, for example, a computer network (e.g., LAN or WAN), an Internet, and a telephone network.

Each of the first and second external electronic devices 702 and 704 may be a device of which the type is different from or the same as that of the electronic device 701. The server 706 may include a group of one or more servers. All or a portion of operations that the electronic device 701 will perform may be executed by another or plural electronic devices. When the electronic device 701 executes any function or service automatically or in response to a request, the electronic device 701 may not perform the function or the service internally, but, alternatively, it may request at least a portion of a function associated with the electronic device 701 at another electronic device. The other electronic device may execute the requested function or additional function and may transmit the execution result to the electronic device 701. The electronic device 701 may provide the requested function or service using the received result or may additionally process the received result to provide the requested function or service. To this end, for example, cloud computing, distributed computing, or client-server computing may be used.

The term "module", as used herein, may represent, for example, a unit including one or more combinations of hardware, software and firmware. The term "module" may be interchangeably used with the terms "unit", "logic", "logical block", "component" and "circuit". A "module" may be a minimum unit of an integrated component or may be a part thereof. A "module" may be a minimum unit for performing one or more functions or a part thereof. A "module" may be implemented mechanically or electronically. For example, a "module" may include at least one of an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) may be, for example, implemented by instructions stored in computer-readable storage media in the form of a program module. The instruction, when executed by a processor, may cause the one or more processors to perform a function corresponding to the instruction. The computer-readable storage media, for example, may be the memory.

A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and hardware devices (e.g., a read only memory (ROM), a random access memory (RAM), or a flash memory). Also, a program instruction may include not only a mechanical code such as things generated by a compiler but also a high-level language code executable on a computer using an interpreter. The above hardware unit may be configured to operate via one or more software modules for performing an operation of various embodiments of the present disclosure, and vice versa.

A module or a program module may include at least one of the above elements, or a part of the above elements may be omitted, or additional elements may be included. Operations performed by a module, a program module, or other elements may be executed sequentially, in parallel, repeatedly, or in a heuristic method. In addition, some operations may be executed in different sequences or may be omitted. Alternatively, other operations may be added.

While the disclosure has been shown and described with reference to various embodiments thereof, it will be understood by those skilled in the art that various changes in form and detail may be made therein without departing from the spirit and scope of the disclosure as defined by the appended claims and their equivalents.

What is claimed is:

1. An electronic device, comprising:
    an antenna configured to receive a first signal and transmit a second signal;
    a transceiver configured to perform frequency conversion of the first signal and the second signal;

a coupler path configured to transmit the second signal to the transceiver via a coupler;
a receive path configured to transmit the first signal, obtained from the antenna, to the transceiver; and
a switching unit configured to be connected with the transceiver and switch between the coupler path and the receive path,
wherein the switching unit is connected between the transceiver and a duplexer.

2. The electronic device of claim 1, wherein:
the transceiver comprises a detection port and a receive port; and
wherein the switching unit is configured to:
connect the coupler path with the detection port of the transceiver and connect the receive path with the receive port of the transceiver, in a first mode; and
connect the coupler path with the receive port of the transceiver and connect the receive path with the detection port of the transceiver, in a second mode.

3. The electronic device of claim 1, wherein the receive path comprises:
a low noise amplifier (LNA) configured to amplify the first signal.

4. The electronic device of claim 3, wherein the LNA is connected with the switching unit.

5. The electronic device of claim 1, further comprising:
an amplifier configured to amplify a power of the second signal,
wherein the coupler is connected to the amplifier.

6. The electronic device of claim 1, wherein the coupler is connected to an output end of a duplexer on a transmit path.

7. The electronic device of claim 1, wherein the transceiver comprises:
a down-conversion mixer configured to convert a frequency of a signal input via a receive port of the transceiver.

8. The electronic device of claim 7, wherein the transceiver further comprises:
a local oscillator (LO) configured to generate an LO signal input to the down-conversion mixer.

9. An electronic device, comprising:
an antenna configured to receive a first signal and transmit a second signal;
a transceiver configured to perform frequency conversion of the first signal and the second signal;
a coupler path configured to transmit the second signal to the transceiver via a coupler;
a plurality of receive paths configured to transmit the first signal, obtained from the antenna, to the transceiver; and
a switching unit configured to be connected with the transceiver and switch between the coupler path and at least one of the plurality of receive paths,
wherein the switching unit is connected between the transceiver and a duplexer.

10. The electronic device of claim 9, wherein:
the transceiver comprises a detection port and a plurality of receive ports; and
wherein the switching unit is configured to:
connect the coupler path with the detection port of the transceiver and connect the at least one of the plurality of receive paths with at least one of the plurality of receive ports, in a first mode; and
connect the coupler path with any one of the plurality of receive ports of the transceiver and connect any one of the plurality of receive paths with the detection port of the transceiver, in a second mode.

11. The electronic device of claim 9, wherein each of the plurality of receive paths comprises a duplexer.

12. The electronic device of claim 9, wherein the plurality of receive paths comprise at least one low noise amplifier (LNA).

13. The electronic device of claim 12, wherein the switching unit is connected to the at least one LNA.

* * * * *